(12) United States Patent
Srivastava

(10) Patent No.: US 11,011,216 B1
(45) Date of Patent: May 18, 2021

(54) COMPUTE-IN-MEMORY DYNAMIC RANDOM ACCESS MEMORY

(71) Applicant: QUALCOMM Incorporated, San Diego, CA (US)

(72) Inventor: Ankit Srivastava, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/810,475

(22) Filed: Mar. 5, 2020

(51) Int. Cl.
| | |
|---|---|
| G11C 11/403 | (2006.01) |
| G11C 11/406 | (2006.01) |
| G11C 11/405 | (2006.01) |
| G11C 11/4097 | (2006.01) |
| G11C 11/4074 | (2006.01) |
| H03K 7/08 | (2006.01) |
| G11C 11/56 | (2006.01) |
| G11C 7/12 | (2006.01) |
| G11C 5/14 | (2006.01) |
| H01L 27/108 | (2006.01) |
| G11C 11/4076 | (2006.01) |

(52) U.S. Cl.
CPC ........... *G11C 11/406* (2013.01); *G11C 5/145* (2013.01); *G11C 7/12* (2013.01); *G11C 11/405* (2013.01); *G11C 11/4074* (2013.01); *G11C 11/4076* (2013.01); *G11C 11/4097* (2013.01); *G11C 11/565* (2013.01); *H01L 27/108* (2013.01); *H03K 7/08* (2013.01)

(58) Field of Classification Search
CPC ......... G11C 11/406; G11C 5/145; G11C 7/12; G11C 11/405; G11C 11/4074; G11C 11/4076; G11C 11/4097; H03K 7/08
USPC .......................................................... 365/149
See application file for complete search history.

(56) References Cited

U.S. PATENT DOCUMENTS

| | | | | |
|---|---|---|---|---|
| 7,088,606 | B2 * | 8/2006 | Turner | G11C 5/005 365/149 |
| 7,602,634 | B2 * | 10/2009 | Turner | G11C 5/005 365/149 |
| 9,343,138 | B2 * | 5/2016 | Antonyan | G11C 11/4087 |
| 9,722,615 | B2 * | 8/2017 | Kurokawa | H03K 19/17756 |
| 2005/0201141 | A1 * | 9/2005 | Turner | G11C 11/405 365/149 |
| 2017/0033798 | A1 * | 2/2017 | Kurokawa | H03K 19/17756 |

\* cited by examiner

*Primary Examiner* — Xiaochun L Chen
(74) *Attorney, Agent, or Firm* — Qualcomm Incorporated

(57) ABSTRACT

A compute-in-memory dynamic random access memory bitcell is provided that includes a first transistor having an on/off state controlled by a weight bit stored across a capacitor. The first transistor is in series with a current-source transistor connected between the first transistor and a read bit line. An activation voltage controls whether the current-source transistor conducts a current when the first transistor is in the on state.

20 Claims, 9 Drawing Sheets

COMPUTE-IN-MEMORY DYNAMIC RANDOM ACCESS MEMORY

TECHNICAL FIELD

This application relates to compute-in-memories, and more particularly to a dynamic random access memory compute-in-memory bitcell.

BACKGROUND

Computer processing of data typically uses a Von Neumann architecture in which the data is retrieved from a memory to be processed in an arithmetic and logic unit. In computation-intensive applications such as machine learning, the data flow from and to the memory becomes a bottleneck for processing speed. To address this data-movement bottleneck, compute-in-memory architectures have been developed in which the data processing hardware is distributed across the bitcells.

SUMMARY

In accordance with a first aspect of the disclosure, a dynamic-random-access-memory (DRAM) multiply-and-accumulate circuit (MAC) is provided that includes: a read bit line; a first transistor; a capacitor connected between a gate of the first transistor and ground; a second transistor connected between the read bit line and the first transistor; and a digital-to-analog converter configured to convert an input bit into an activation voltage and to drive a gate of the second transistor with the activation voltage.

In accordance with a second aspect of the disclosure, a dynamic-random-access-memory (DRAM) array is provided that includes: a plurality of DRAM bitcells arranged into a plurality of columns and a plurality of rows, each DRAM bitcell being located at an intersection of a corresponding one of the columns and a corresponding one of the rows; a plurality of read bit lines corresponding to the plurality of columns; and a digital-to-analog converter configured to convert an input vector into a plurality of activation voltages corresponding to the plurality of rows, each DRAM bitcell being configured to store a weight bit and to discharge the corresponding column's read bit line responsive to the corresponding row's activation voltage and to the stored weight bit.

In accordance with a third aspect of the disclosure, a compute-in-memory method for a dynamic-random-access-memory (DRAM) bitcell is provided that includes: switching on a first transistor responsive to a first weight bit stored across a capacitor; while the first transistor is switched on, switching on a second transistor for an on-time period responsive to a first input bit; and conducting charge from a charged read bit line to ground through the switched-on first transistor and through the switched-on second transistor for a duration of the on-time period.

In accordance with a fourth aspect of the disclosure, a dynamic-random-access-memory (DRAM) multiply-and-accumulate circuit (MAC) is provided that includes: a read bit line; first means for charging the read bit line responsive to a first polarity for a stored weight bit and responsive to an input bit; and second means for discharging the read bit line responsive to a second polarity for the stored weight bit and responsive to the input bit.

These and other advantageous features may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

It is cumbersome to use a traditional Von Neumann architecture for machine learning applications as data flow from and to the memory becomes a bottleneck to increasing the processing speed. Compute-in-memory bitcell architectures have thus been developed in which the data processing hardware is distributed across the bitcells. To implement the compute-in-memory bitcells, a conventional choice is either a static-random-access-memory (SRAM) architecture or a dynamic-random-access-memory (DRAM) architecture. Of these two choices, a DRAM compute-in-memory architecture is advantageous as it is significantly denser than the comparable SRAM alternative.

Although a digital DRAM compute-in-memory architecture offers better density, its implementation has encountered from a number of issues. For example, it is conventional to utilize a digital DRAM compute-in-memory architecture for machine learning applications. But note that DRAM typically uses large channel length devices that provide low leakage but are relatively slow and have relatively high capacitance. To address these issues, an analog DRAM compute-in-memory architecture is provided herein. The longer channel length of DRAM architectures is actually beneficial for an analog architecture. In addition, a current-domain computation performed by the analog architecture disclosed herein is not hindered by the relatively-high device capacitance of DRAM implementations.

Figure 1A:
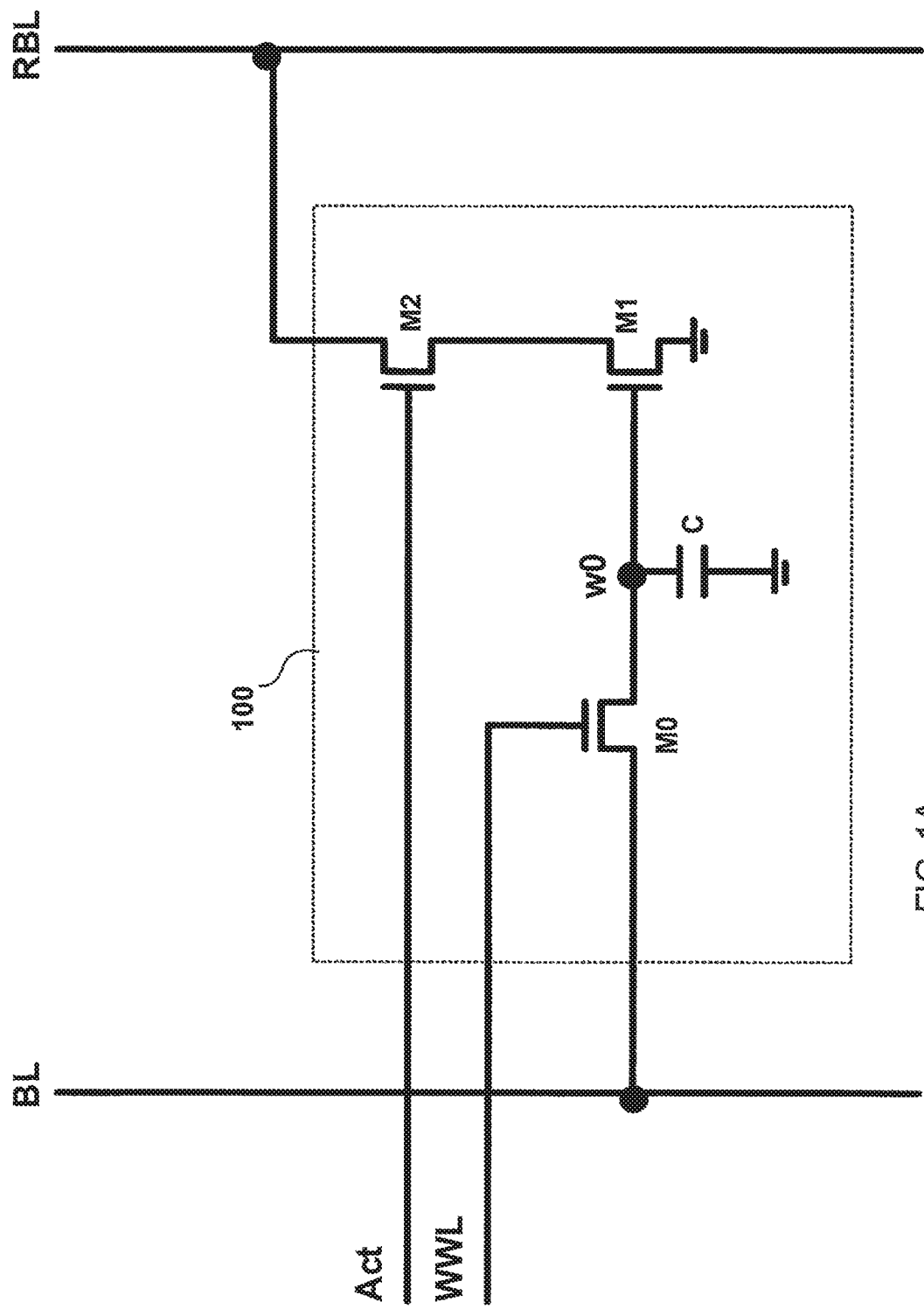
FIG. 1A illustrates a first example DRAM compute-in-memory bitcell for an AND logical function computation in accordance with an aspect of the disclosure.

The analog current-domain computation is performed by a DRAM bitcell having an architecture that depends upon whether a stored weight bit in the DRAM bitcell has a polarity (a positive or negative sign). A single-polarity DRAM bitcell will be discussed first followed by a discussion of a DRAM bitcell in which the stored weight bit is a signed stored weight bit. An example three-transistor (3T) DRAM bitcell 100 is shown in FIG. 1A for a single-polarity stored weight bit. A capacitor C stores the weight bit (w0) for bitcell 100. Prior to a write of the weight bit into bitcell 100, a write bit line (denoted herein simply as a bit line for brevity) BL is charged according to the binary value of the weight bit. Should the weight bit be a binary one, the bit line BL is charged to a power supply voltage VDD (in an active-high implementation). Conversely, the bit line BL is discharged to ground if the weight bit is a binary zero (the bit line states may be reversed in an active-low implementation). To write the weight bit into bitcell 100, a write word line (WWL) is asserted to the power supply voltage VDD to switch on an n-type metal-oxide semiconductor (NMOS) access transistor M0 connected between the bit line BL and a positive plate of capacitor C. The negative plate of capacitor C connects to ground. Depending upon the binary value of the weight bit, the capacitor C will either be charged to the power supply voltage VDD or be discharged.

Although bitcell 100 is used to multiply an input bit with the weight bit to form a multiply-and-accumulate circuit, note that in deep learning applications such a multiplication is performed for various input bits and various corresponding weight bits in a convolution operation typically denoted as a "filter." In the deep learning arts, the input bit is typically denoted as an "activation" due to an analogy to biological neurons that are also deemed to process activations. A filter will thus include a plurality of bitcells 100 for the multiplications of the corresponding activations (input bits) and the stored weight bits.

To form the activations, a digital-to-analog converter (DAC) is disclosed (not illustrated in FIG. 1A) for the conversion of the input bits into activation voltages. In bitcell 100, one of the activation voltages (Act) drives a gate of an NMOS transistor M2. A source of transistor M2 connects to a drain of an NMOS transistor M1 having a source connected to ground. The positive plate of capacitor C also connects to agate of transistor M1. The stored weight bit thus controls whether transistor M1 is switched on or off. As used herein, "connected" refers to a direct electrical connection although such a direct connection may be accomplished through an intervening element such as a resistor, a capacitor, or an inductor. The drain of transistor M2 connects to a read bit line (RBL). Prior to an evaluation phase in which the stored weight bit and the input bit are multiplied and accumulated to adjust a voltage of the read bit line, the read bit line is charged to an evaluation voltage (e.g., to the power supply voltage VDD).

Suppose that the weight bit (w0) is a binary one value such that transistor M1 is switched on. Depending upon the value of the activation voltage, transistor M2 is then switched on so as to act as a current source that conducts charge from the read bit line through transistors M2 and M1 to ground. But if either the activation voltage or the weight bit is grounded (a binary zero), then no charge is conducted from the read bit line to ground. DRAM bitcell 100 thus functions as an AND gate to calculate the binary multiplication of the input bit with the weight bit. A comparator (not illustrated in FIG. 1A) can then compare the voltage of the read bit line to a threshold voltage to determine the result of the AND operation. As will be discussed further herein, DRAM bitcell 100 may be modified so that the multiplication of the input bit and the stored weight bit may be performed using an exclusive not-OR (XNOR) operation to account for a polarity of the stored weight bit. Regardless of whether the multiplication is performed using an AND or an XNOR operation, the resulting current domain computation is quite advantageous as it is compatible with the longer channel lengths and relatively-large device capacitances resulting from DRAM manufacturing techniques.

Figure 1B:
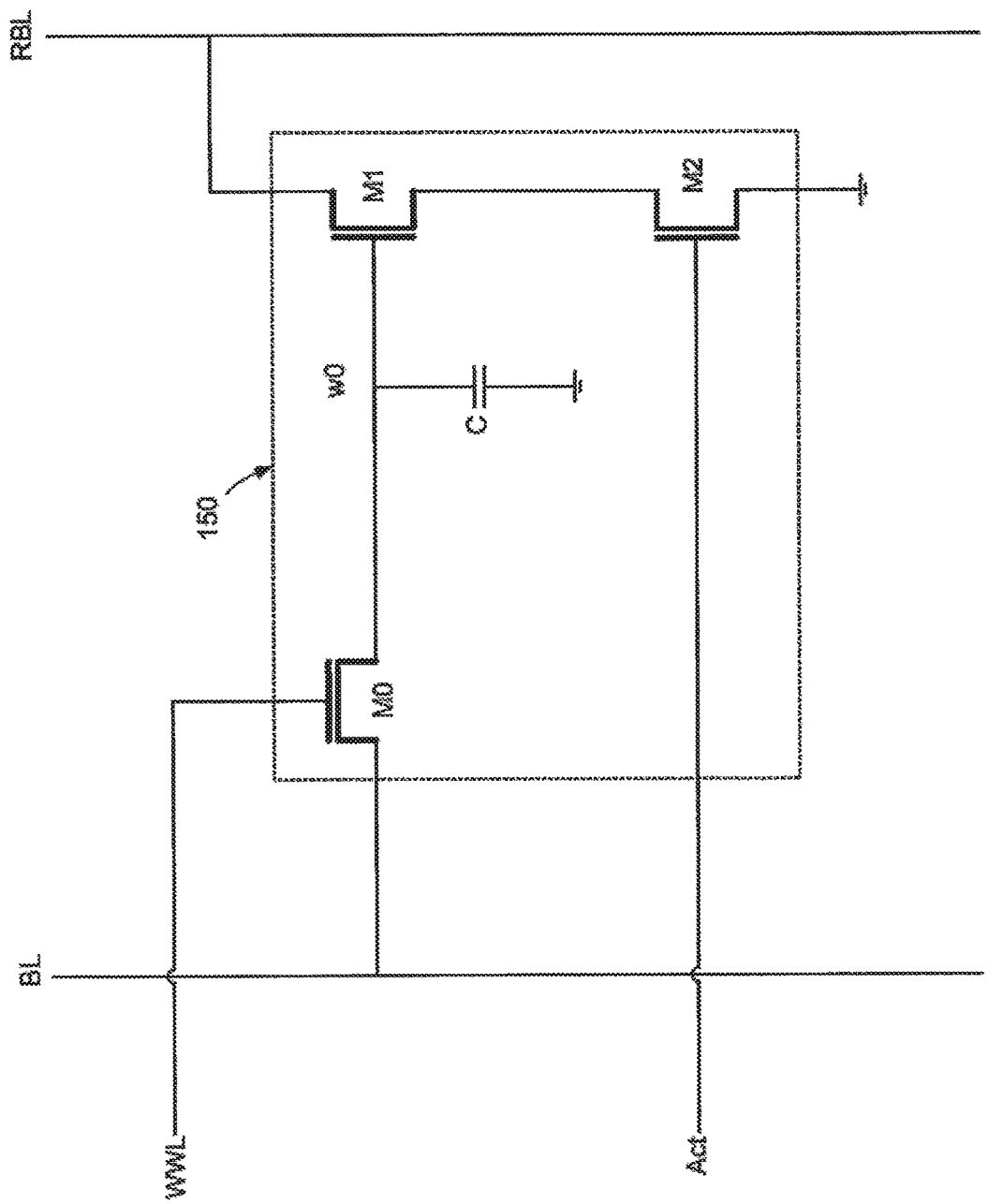
FIG. 1B illustrates a second example DRAM compute-in-memory bitcell for an AND logical function computation in accordance with an aspect of the disclosure.

It will be appreciated that the positions of transistors M1 and M2 may be reversed in alternative embodiments such as shown for a DRAM bitcell 150 in FIG. 1B. In bitcell 150, the source of transistor M2 connects to ground and a drain of transistor M2 connects to a source of transistor M1 that in turn has a drain connected to the read bit line. The remainder of DRAM bitcell 150 is arranged as discussed for DRAM bitcell 100.

Figure 2:
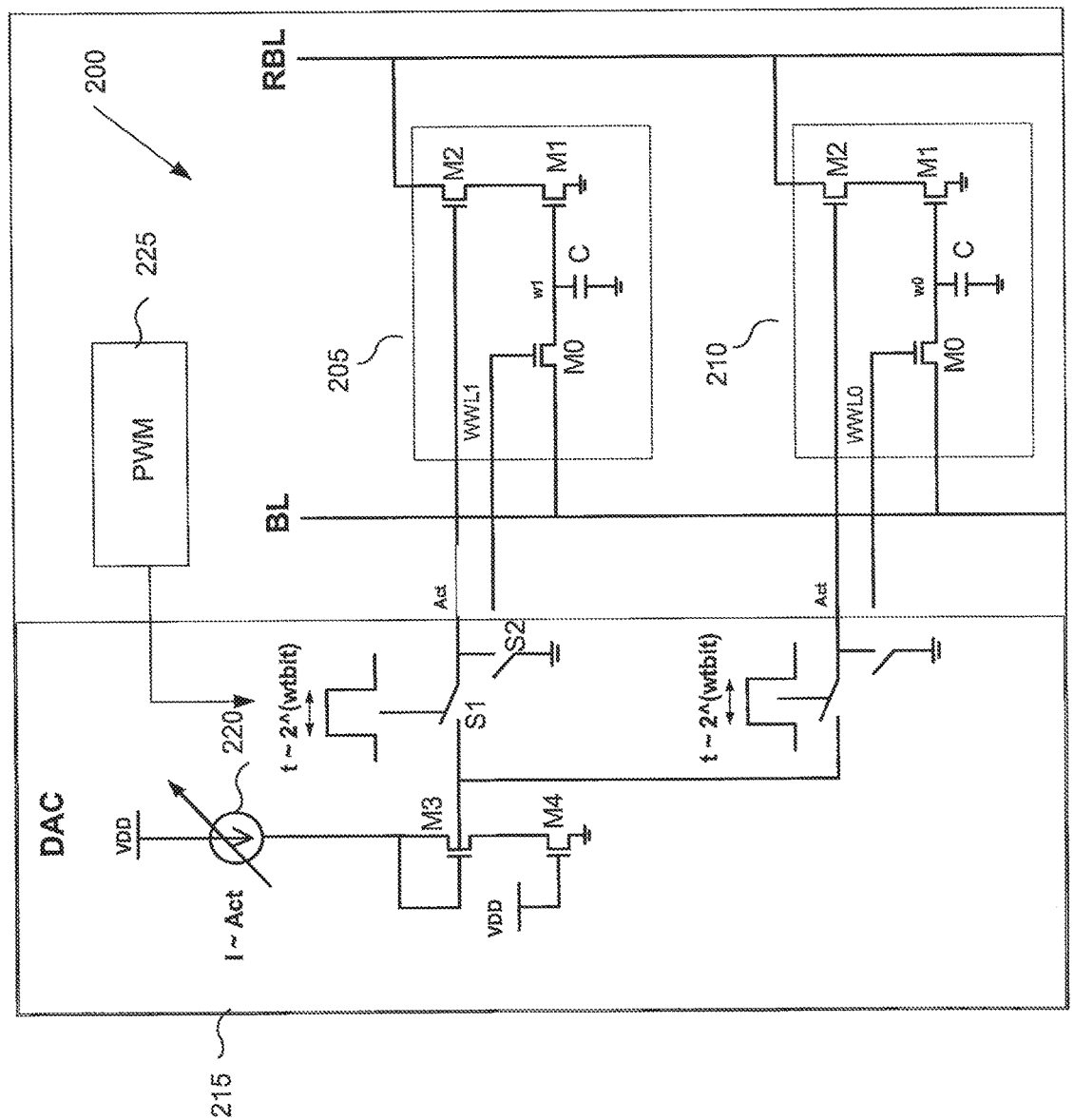
FIG. 2 illustrates an example filter of DRAM compute-in-memory bitcells for the multiplication of a two-bit weight in accordance with an aspect of the disclosure.

The resulting multiply-and-accumulate circuit may be repeated to form a filter for the multiplication of a multi-bit weight with an input vector bit (or bits). An example filter 200 of DRAM compute-in-memory bitcells is shown in FIG. 2 for a 2-bit weight computation. A first DRAM bitcell 205 stores the most-significant bit (w1) of the 2-bit weight whereas a second DRAM bitcell 210 stores the least significant bit (w0) of the 2-bit weight. Each of bitcells 205 and 210 includes a capacitor C, a transistor M0, a transistor M1, and a transistor M2 as discussed with regard to bitcell 100. A DAC 215 converts an input vector (e.g., a two-bit input vector) into a current through a variable current source 220. Current source 220 drives the current into a drain and a gate of a diode-connected NMOS transistor M3. The gate of NMOS transistor M3 connects through a pulse-width-modulated switch S1 (e.g. a switch transistor) to the gate of transistor M2 in bitcell 205. Similarly, the gate of NMOS transistor M3 connects through another pulse-width-modulated switch S1 (e.g, another switch transistor) to the gate of transistor M2 in bitcell 210. But note that the source of each transistor M2 couples to ground through a corresponding transistor M1. To provide the same source voltage to diode-connected transistor M3 as experienced by each transistor M2, the source of diode-connected transistor M3 couples to ground through an NMOS transistor M4. A gate of transistor M4 connects to a power supply node for the power supply voltage VDD. Transistor M4 thus mimics the behavior of transistor M1 in each bitcell 205 or 210 that is programmed with a binary one value such that its transistor M1 is switched on. In those programmed bitcells, diode-connected transistor M3 thus forms a current mirror with the programmed bitcell's transistor M2 such that this transistor M2 conducts a mirrored version of the current from current source 220. Transistor M4 may be omitted in embodiments in which the positions of transistors M1 and M2 is reversed as discussed above.

A pulse-width modulator 225 controls the pulse-width modulation of switches S1 according to the bit weight for bitcells 205 and 210. Since bitcell 205 is storing the most-significant bit w1, switch S1 in bitcell 205 is pulsed on for a pulse width that is two times greater than the on-time for switch S1 in bitcell 210. After the pulse-widths have expired for the switches S1 (the end of a current-mode computation), the charge Q that was discharged from the read bit line is proportional to the input vector bit (or bits) times the stored weight bits. Once the read bit line voltage is evaluated to determine the result of the current-mode calculation, a reset switch S2 in each bitcell 205 and 210 is closed that connects between the gate of the corresponding transistor M2 and ground to discharge the gate voltage. A new evaluation phase may then proceed with a new value for the input bits and/or for the stored weight bits.

It will be appreciated that additional bitcells would be used if the stored weight was greater than two bits in width.

Figure 3:
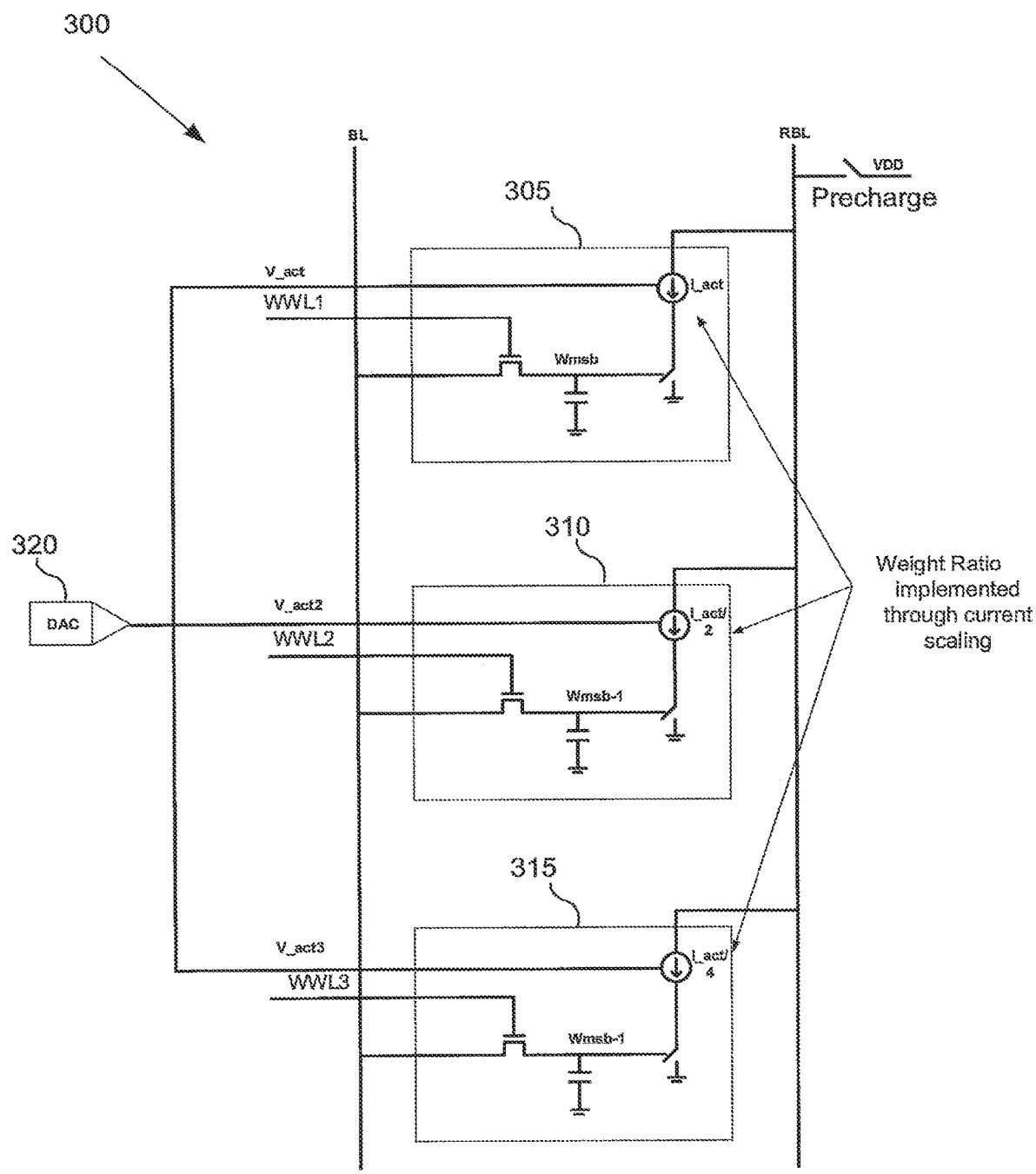
FIG. 3 illustrates an example filter of DRAM compute-in-memory bitcells for the multiplication of a three-bit weight in accordance with an aspect of the disclosure.

For example, a 3-bit-wide weight filter 300 is shown in FIG. 3. A bitcell 305 stores the most-significant bit (Wmsb) of the 3-bit-wide weight. A bitcell 310 stores the next-most significant bit (Wmsb-1). Finally, a bitcell 315 stores the least-most significant bit (Wmsb-2). Each bitcell in filter 300 may be formed as discussed with regard to bitcell 100. A DAC 320 functions as discussed for DAC 215 to drive the gate of each transistor M2 with the activation voltage so that each transistor conducts the mirrored current that results from the digital-to-analog conversion of the input vector bit (or bits). The following discussion will assume that the input vector has the same precision (bit width) as the stored weight but it will be appreciated that it may be of greater or lesser precision as compared to the stored weight.

The pulse width modulation associated with DAC 320 provides an on-time or pulse-width that is largest for bitcell 305 such that its transistor M2 conducts an activation current I_act. The pulse width modulator (not illustrated) provides bitcell 310 with one-half the on-time for bitcell 300 such that the transistor M2 in bitcell 305 conducts a current I_act/2. Similarly, the pulse width modulator (not illustrated) provides bitcell 315 with one-half the on-time of bitcell 310 such that the transistor M2 in bitcell 315 conducts a current I_act/4. It will be appreciated that this binary weighting of the on-times can be extended to an n-bit wide stored weight embodiment, where n is a positive integer. In general, the pulse width (the on-time) for a bitcell in an n-bit wide implementation is a binary function of $2^{(wtbit)}$, where wtbit is the bit weight for the bitcell.

The resulting filter performs a multiply-and-accumulate (MAC) function with regard to the multiplication of the input vector bits with the stored weight. For example, in filter 300, the MAC value may be expressed as follows:

$$MAC = \sum_{i=1}^{n} Iin[i] * W[i]$$

where W[i] is the stored weight bit in an ith bitcell and In[i] is the current value for the current conducted by the ith bitcell's transistor M2.

Figure 4:
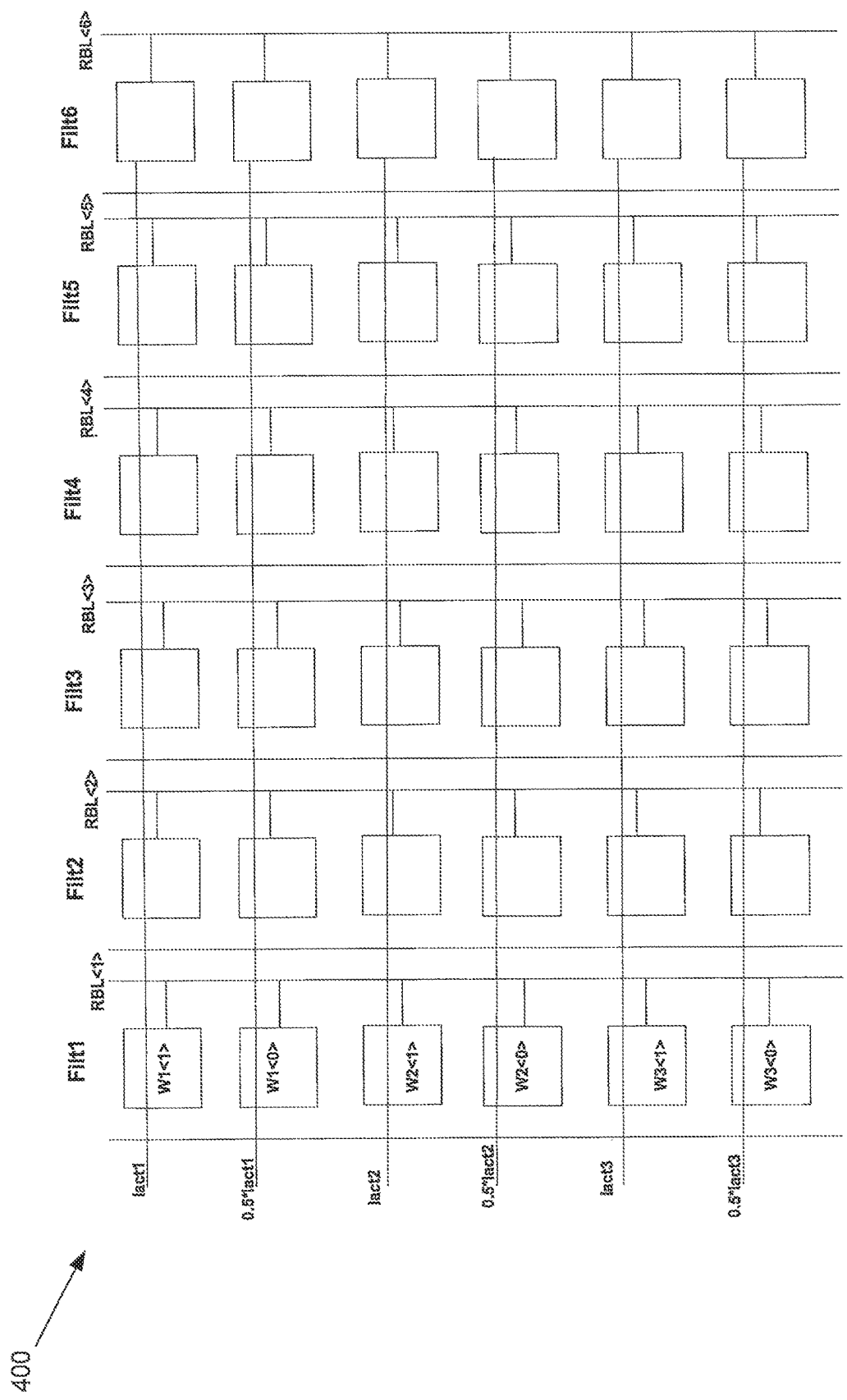
FIG. 4 illustrates an array of DRAM compute-in-memory bitcells arranged by rows and columns to form a plurality of filters in accordance with an aspect of the disclosure.

A compute-in-memory DRAM array of bitcells may be formed using a plurality of filters. For example, a two-bit filter array 400 of bitcells is shown in FIG. 4. The bitcells are arranged by columns and rows. Each column of bitcells shares the same read bit line and write word line. Each bitcell is located at an intersection of a corresponding row and a corresponding column. In array 400, there are six columns with each column defining a two-bit filter ranging from a first filter (Filt1) to a sixth filter (Filt6). Each row of bitcells shares the same current weight from the DAC (not illustrated). Each of the filters extends in the column direction across three stored two-bit binary weights. For example, the first filter stores a first two-bit weight W1 as bits W1<1> and W1<0>, a second two-bit weight as bits W2<1> and W2<0>, and a third two-bit weight as bits W3<1> and W3<2>. Each stored bit is multiplied with a corresponding input bit as represented by a current. For example, bit W1<1> is multiplied using a current Iact1 whereas bit W1<0> is multiplied using a current 0.5*Iact1. Similarly, bit W2<1> is multiplied using a current Iact2 whereas bit W2<0> is multiplied using a current 0.5*Iact2. Finally, bit W3<1> is multiplied using a current Iact3 whereas bit W3<0> is multiplied using a current 0.5*Iact3. The remaining filters are arranged analogously. The weights for the remaining filters are not shown for illustration clarity.

Figure 5:
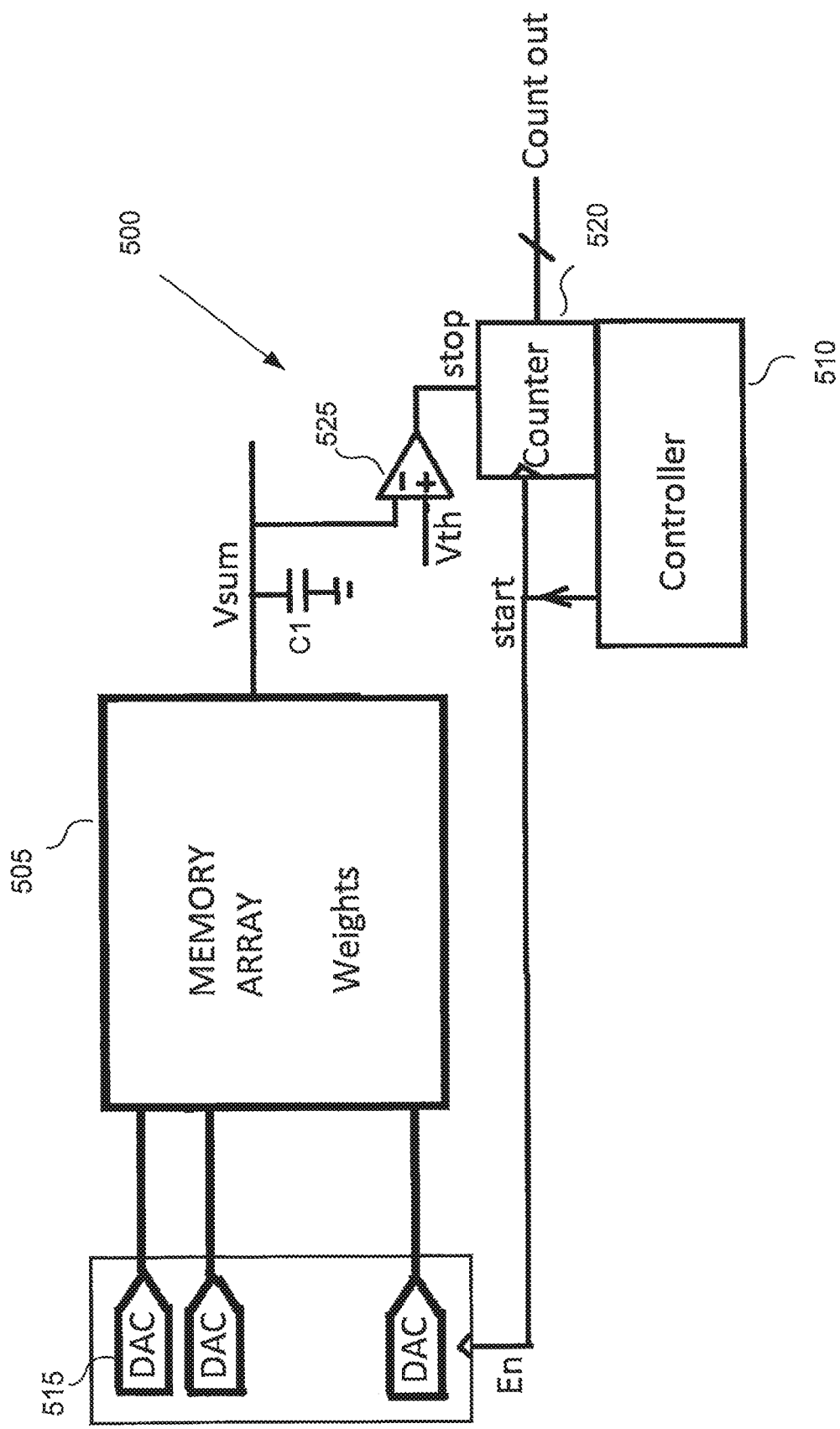
FIG. 5 illustrates an example analog-to-digital converter for the conversion of the read bit line voltages into digital values in accordance with an aspect of the disclosure.

An analog-to-digital converter (ADC) converts the voltage that remains on each read bit line following an evaluation phase to determine the result of the multiply-and-accumulate function. An example ADC 500 is shown in FIG. 5 for an array 505 of bitcells. Array 505 is arranged such as discussed for array 400. Referring again to FIG. 4, each read bit line for a filter extends across several different weights. The bits for these various weights are multiplied with a current from a corresponding DAC. As shown in FIG. 5, there is thus a DAC 515 for each multi-bit weight for a given filter (the filters in array 505 are not shown for illustration clarity but are analogous to the filters discussed for array 400). Each filter (which may also be denoted as a column of bitcells) has its own read bit line but only a single read bit line having a voltage Vsum is shown in FIG. 5 for illustration clarity. To increase the capacitance of the read bit line so as to store sufficient charge when the read bit line is pre-charged prior to an evaluation phase, a read-bit-line capacitor C1 may connect between the read bit line and ground. However, if the read bit line capacitance is sufficiently large, capacitor C1 may be omitted in alternative implementations. Prior to the evaluation phase, the read bit line is pre-charged such as to the power supply voltage VDD. Following the pre-charge, a controller 510 enables each DAC 515 to begin sourcing the appropriate currents as determined from the input vector bits. At the same time, controller 510 enables a counter 520 to begin counting responsive to cycles of a clock signal from a clock source (not illustrated). Depending upon the current and the stored weights, charge from the read bit line will be drained at a corresponding rate. A comparator 525 compares the read bit line voltage to a threshold voltage. When the read bit line voltage is discharged below the threshold voltage, comparator 525 triggers counter 520 to stop counting. The resulting count represents the digital value from the multiplication of the corresponding input bits and stored weight bits. Counter 520 thus functions as a time-to-digital converter and may be readily scaled to a desired DRAM technology node. The various filters may all be calculated in parallel such that there would be a counter 520 and a comparator 525 for each filter.

Figure 6:
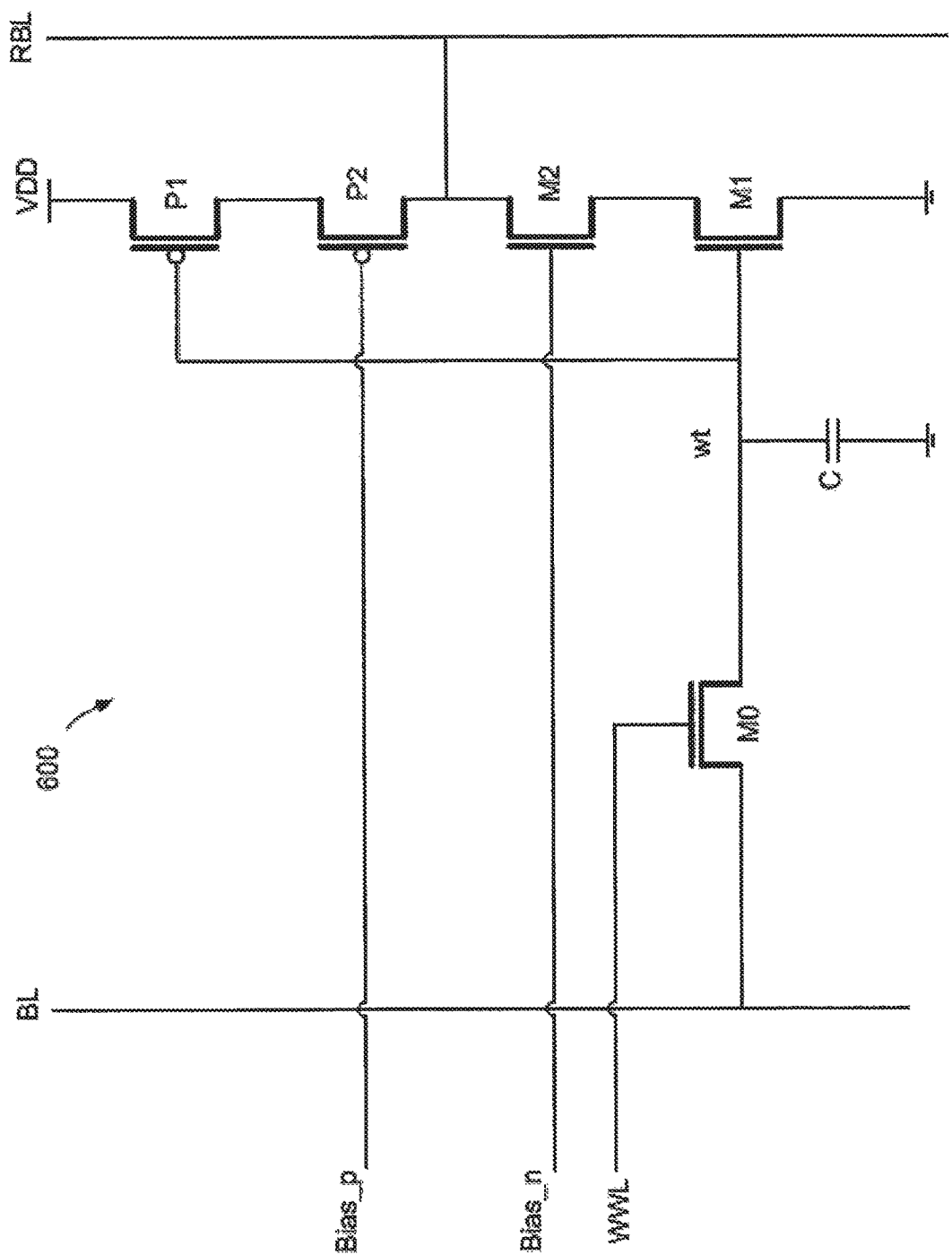
FIG. 6 illustrates an example DRAM compute-in-memory bitcell for an exclusive-not-OR (XNOR) logical function computation in accordance with an aspect of the disclosure.

As noted earlier, bitcell 100 is configured to perform a logical AND function of the stored binary weight bit with the input bit. If the binary weight and the input bit are both logical true values, then bitcell 100 discharges the read bit line for whatever pulse width is applicable given the significance of the stored weight bit. But it may be useful in machine learning applications for the stored binary weight to have a polarity, i.e, to have either a positive or negative sign. Since bitcell 100 can only discharge the read bit line, the stored binary weight bit can be deemed to have only a single polarity. But a bitcell 600 shown in FIG. 6 allows a stored binary weight bit w1 to have either a positive or negative sign. Bitcell 600 is arranged analogously as discussed for bitcell 100 but also includes a PMOS transistor P1 having a source connected to a power supply node for a power supply voltage VDD. A drain of transistor P1 connects to a source of a PMOS transistor P2 having a drain connected to the drain of transistor M2 and to the read bit line. A first bias signal Biasp drives a gate of transistor P2. Similarly, a second bias signal Biasn drives a gate of transistor M2. The polarity of a stored weight bit wt controls the first and second bias signals. In the following discussion, it will be assumed that a positive polarity for the stored weight bit wt switches on transistor M2 and switches off transistor P2 whereas a negative polarity for the stored weight bit wt switches on transistor P2 and switches off transistor M2. However, in alternative implementations, this polarity control may be reversed.

To make this polarity assignment for the stored weight bit wt, a value of 0 V for the voltage across the capacitor C may be deemed to equal −1 whereas a positive value for this same capacitor voltage may be deemed to equal a +1. With the stored weight bit wt equaling a +1, transistor M1 is switched on. Referring again to FIG. 2, the second bias signal Biasn is produced as discussed with regard to the activation signal such that transistor M2 will conduct a mirrored current for the appropriate on-time period if the input bit is true to discharge the read bit line accordingly. But if the stored weight bit wt equals a −1, transistors M1 and M2 are off. Instead, it is then transistor P1 that is switched on since the gate of the transistor P1 is connected to the gate of transistor M1. A second current mirror (not illustrated) may then generate the first bias signal Biasp for the appropriate on-time period given this polarity if the input bit is true to switch on transistor P2 to conduct a mirrored current to charge the read bit line when the stored binary weight bit equals a −1. It may thus be shown that the resulting operation of bitcell 600 is equivalent to a logical XNOR of the stored weight bit and the input bit. Since bitcell 600 can both charge or discharge the read bit line, the read bit line is not pre-charged to the power supply voltage VDD prior to the evaluation phase but instead is pre-charged to an intermediate voltage such as VDD/2.

In one embodiment, transistors P1 and P2 may be deemed to form a first means for charging the read bit line responsive to a first polarity for a stored weight bit and responsive to an input bit. Similarly, transistors M1 and M2 may be deemed to form a second means for discharging the read bit line responsive to a second polarity for the stored weight bit and responsive to the input bit.

Figure 7:
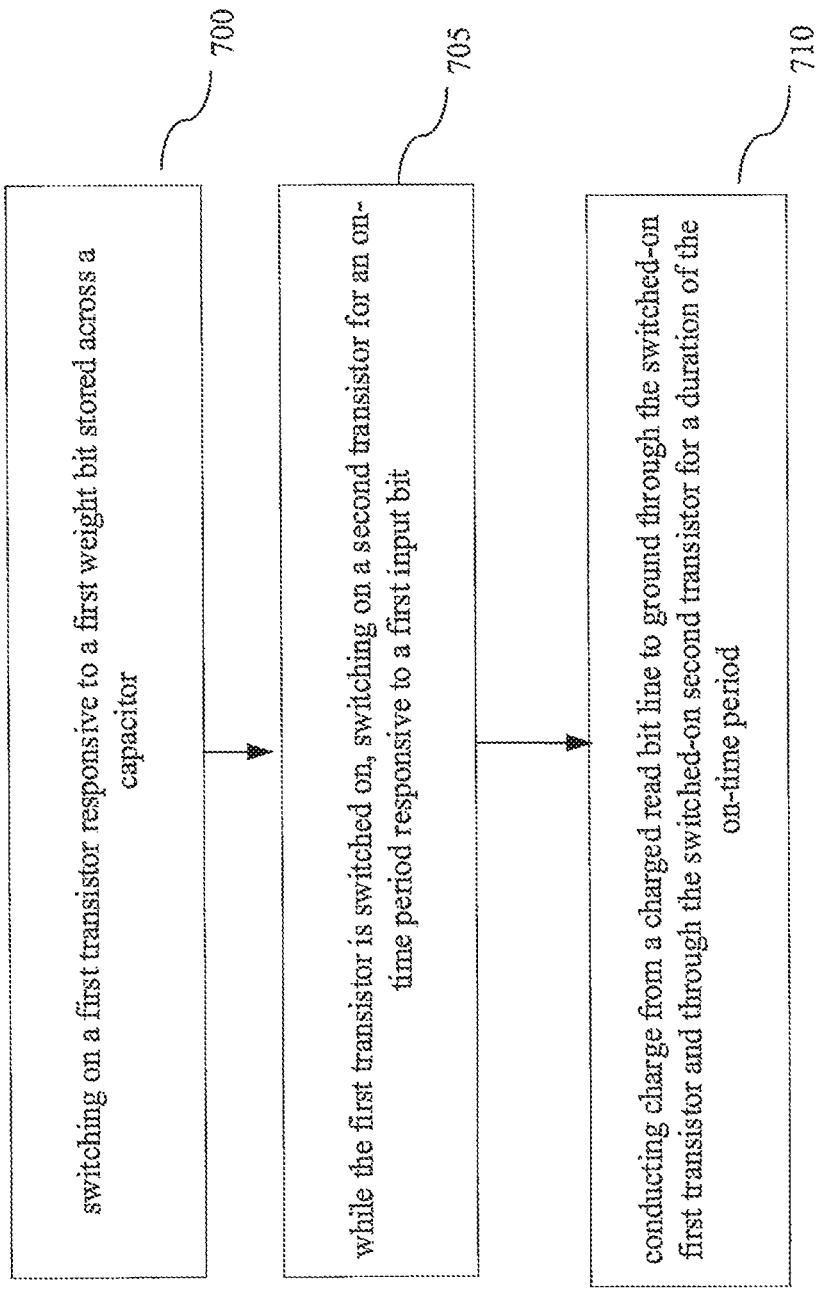
FIG. 7 is a flowchart for an example DRAM compute-in-memory bitcell operation in accordance with an aspect of the disclosure.

A method of operation of operation for a DRAM compute-in-memory bitcell will now be discussed with regard to the flowchart of FIG. 7. The method includes an act 700 of switching on a first transistor responsive to a first weight bit stored across a capacitor. The switching on of transistor M1 in bitcell 100 or bitcell 600 is an example of act 700. The method also includes an act 705 of, while the first transistor is switched on, switching on a second transistor for an on-time period responsive to a first input bit. The switching on of transistor M2 in bitcell 100 or bitcell 600 is an example of act 705. Finally, the method includes an act 710 of conducting charge from a charged read bit line to ground through the switched-on first transistor and through the switched-on second transistor for a duration of the on-time period. The discharge of the read bit line through transistors M1 and M2 during the appropriate on-time period in bitcell 100 or bitcell 600 is an example of act 710.

Figure 8:
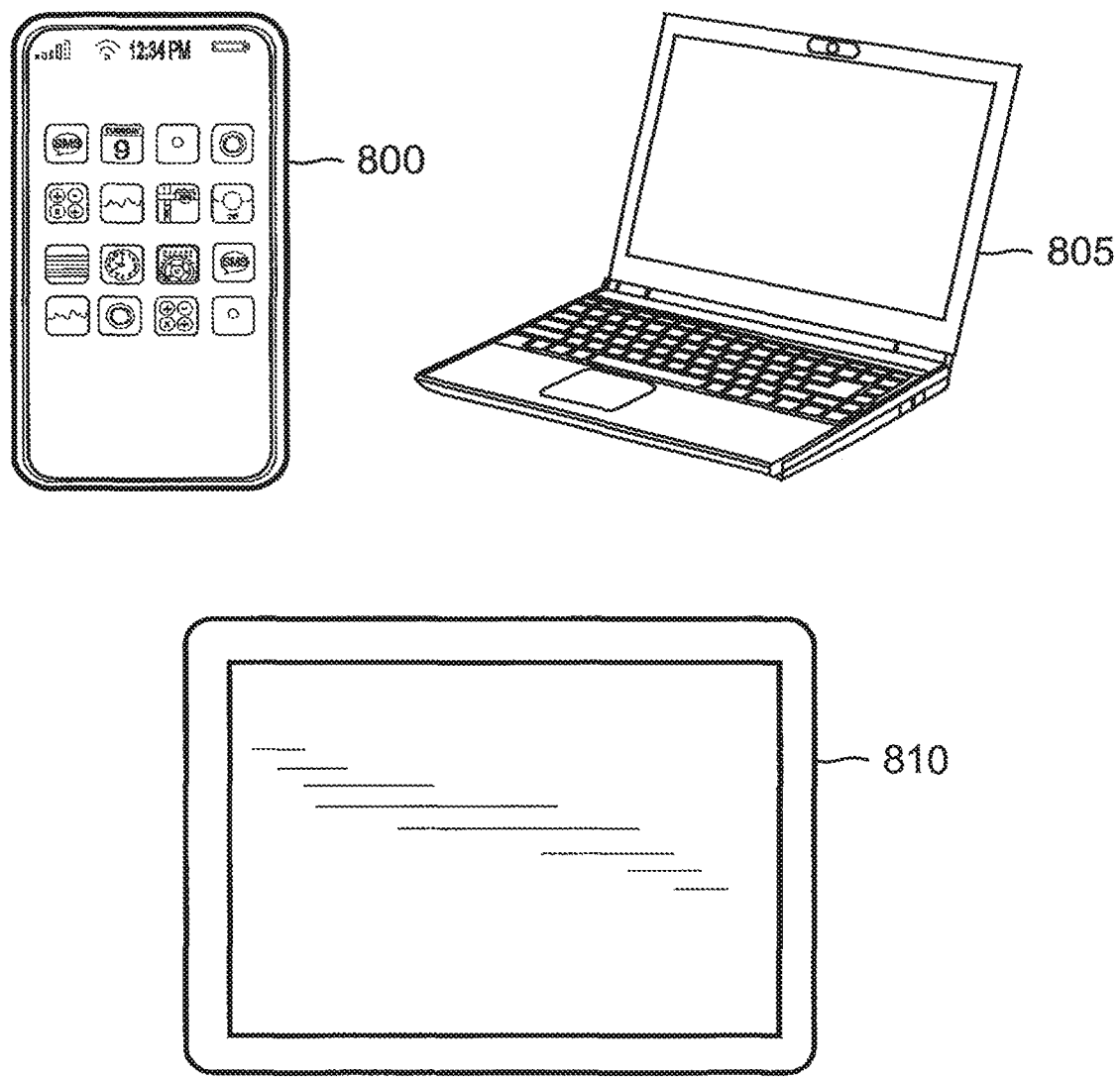
FIG. 8 illustrates some example electronic systems including a DRAM compute-in-memory bitcell array in accordance with an aspect of the disclosure.

A compute-in-memory bitcell as disclosed herein may be advantageously incorporated in any suitable mobile device or electronic system. For example, as shown in FIG. 8, a cellular telephone 800, a laptop computer 805, and a tablet PC 810 may all include an array of compute-in-memory DRAM bitcells such as for machine learning applications in accordance with the disclosure. Other exemplary electronic systems such as a music player, a video player, a communication device, and a personal computer may also be configured with compute-in-memories constructed in accordance with the disclosure. Similarly, a compute-in-memory as disclosed herein may be incorporated into a server such as in a cloud-based application or in a base station such in a 5G system.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

I claim:

1. A dynamic-random-access-memory (DRAM) multiply-and-accumulate circuit (MAC), comprising:
   a read bit line;
   a first transistor;
   a capacitor connected between a gate of the first transistor and ground;
   a second transistor connected between the read bit line and the first transistor; and
   a digital-to-analog converter configured to convert an input bit into an activation voltage and to drive a gate of the second transistor with the activation voltage,
   wherein the digital-to-analog converter includes:
   a variable current source configured to generate a current responsive to the input bit; and
   a diode-connected transistor, wherein the variable current source is further configured to drive the current into a terminal of the diode-connected transistor to generate the activation voltage.

2. The DRAM MAC of claim 1, further comprising:
   a write bit line;
   an access transistor connected between the write bit line and the capacitor; and
   a write wordline connected to a gate of the access transistor.

3. The DRAM MAC of claim 1, further comprising:
   a pulse-width modulator; and
   a first switch; wherein a gate of the diode-connected transistor is connected to a gate of the second transistor through the first switch, and wherein the pulse-width modulator is further configured to control an on-time of the first switch during an evaluation phase.

4. The DRAM MAC of claim 3, wherein digital-to-analog converter further includes a third transistor connected between a source of the diode-connected transistor and ground, wherein a gate of the third transistor is connected to a power supply node for a power supply voltage.

5. The DRAM MAC of claim 1, further comprising:
   a reset switch connected between the read bit line and a power supply node for a power supply voltage.

6. The DRAM MAC of claim 1, further comprising:
   an analog-to-digital converter configured to convert a voltage of the read bit line into a digital value.

7. The DRAM MAC of claim 3, wherein the analog-to-digital converter includes:
   a comparator configured to compare a voltage for the read bit line to a threshold voltage; and
   a configured to count from a beginning of the on-time to a detection by the comparator that the voltage for the read bit line has crossed the threshold voltage.

8. The DRAM MAC of claim 1, further comprising:
   a read-bit-line capacitor connected between the read bit line and ground.

9. The DRAM MAC of claim 1, wherein the DRAM MAC is integrated into a mobile device.

10. The DRAM MAC of claim 9, wherein the mobile device is a cellular telephone.

11. A dynamic-random-access-memory (DRAM) array, comprising:
 a plurality of DRAM bitcells arranged into a plurality of columns and a plurality of rows, each DRAM bitcell being located at an intersection of a corresponding one of the columns and a corresponding one of the rows;
 a plurality of read bit lines corresponding to the plurality of columns; and
 a digital-to-analog converter configured to convert an input vector into a plurality of activation voltages corresponding to the plurality of rows, each DRAM bitcell being configured to store a weight bit and to discharge the corresponding column's read bit line responsive to the corresponding row's activation voltage and to the stored weight bit,
 wherein the digital-to-analog converter includes:
 a variable current source configured to generate a current responsive to the stored weight bit; and
 a diode-connected transistor, wherein the variable current source is further configured to drive the current into a terminal of the diode-connected transistor to generate the activation voltage.

12. The DRAM array of claim 11, further comprising:
 an analog-to-digital converter configured to convert a voltage for each read bit line into a digital value.

13. The DRAM array of claim 11, wherein each column is configured to form a filter for a deep learning application.

14. The DRAM array of claim 11, wherein each DRAM bitcell is a three-transistor DRAM bitcell.

15. A compute-in-memory method for a dynamic-random-access-memory (DRAM) bitcell, comprising:
 switching on a first transistor responsive to a first weight bit stored across a capacitor;
 while the first transistor is switched on, switching on a second transistor for an on-time period responsive to a first input bit; and
 conducting charge from a charged read bit line to ground through the switched-on first transistor and through the switched-on second transistor for a duration of the on-time period,
 wherein the method is performed during a first evaluation phase, the method further comprising:
 during a second evaluation phase;
 switching on a third transistor in the DRAM bitcell responsive to a second weight bit stored across the capacitor and responsive to a second input bit to charge the read bit line.

16. The compute-memory method of claim 15, wherein the method is performed during a first evaluation phase, the method further comprising:
 during a second evaluation phase:
 switching off the first transistor is responsive to a second weight bit stored across the capacitor.

17. A dynamic-random-access-memory (DRAM) multiply-and-accumulate circuit (MAC), comprising:
 a read bit line;
 a capacitor configured to store a weight bit;
 first means for charging the read bit line responsive to a first polarity for the stored weight bit and responsive to an input bit; and
 second means for discharging the read bit line responsive to a second polarity for the stored weight bit and responsive to the input bit.

18. The DRAM MAC of claim 17, wherein the first means comprises:
 a first transistor;
 a capacitor connected between a gate of the first transistor and ground;
 a second transistor connected between the read bit line and the first transistor.

19. A dynamic-random-access-memory (DRAM) multiply-and-accumulate circuit (MAC), comprising:
 a read bit line;
 a first transistor having a first terminal connected to the read bit line;
 a capacitor connected between a gate of the first transistor and ground;
 a second transistor connected between a second terminal of the first transistor and ground; and
 a digital-to-analog converter configured to convert an input bit into an activation voltage and to drive a gate of the second transistor with the activation voltage,
 wherein the digital-to-analog converter includes:
 a variable current source configured to generate a current responsive to the input bit; and
 a diode-connected transistor, wherein the variable current source is further configured to drive the current into a terminal of the diode-connected transistor to generate the activation voltage.

20. The DRAM MAC of claim 19, further comprising:
 a write bit line;
 an access transistor connected between the write bit line and the capacitor; and
 a write wordline connected to a gate of the access transistor.

* * * * *